A hermetically sealed module which comprises a central core housing including a perimeter side wall and a central core with opposed primary and secondary support surfaces. At least one coupling passageway is formed within the central core adjacent the perimeter side wall. The side wall has an sealed internal/external electrical connector which facilitates communication with the module. A multilayer substrate, with at least one flexible coupling tab, is supported by the primary support surface and at least one surface mounted component is supported by the secondary support surface. The flexible coupling tab passes through the at least one coupling passageway to facilitate coupling of a plurality of components of the multilayer substrate with a plurality of components of the at least one surface mounted component via a SMT connector. Primary and secondary lids are secured to opposed sides of the perimeter side wall and forming the hermetically sealed module.

(12) United States Patent
Dresser (10) Patent No.: US 9,642,265 B2
(45) Date of Patent: May 2, 2017

(54) DENSE OUT OF PLANE INTERCONNECT INSIDE HERMETICALLY SEALED MODULES

(71) Applicant: BAE SYSTEMS Information and Electronic Systems Integration Inc., Nashua, NH (US)

(72) Inventor: Timothy M. Dresser, Nashua, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 203 days.

(21) Appl. No.: 14/744,382

(22) Filed: Jun. 19, 2015

(65) Prior Publication Data
US 2017/0086311 A1    Mar. 23, 2017

Related U.S. Application Data

(60) Provisional application No. 62/014,326, filed on Jun. 19, 2014.

(51) Int. Cl.
*H05K 5/00* (2006.01)
*H05K 5/06* (2006.01)

(52) U.S. Cl.
CPC ........... *H05K 5/0026* (2013.01); *H05K 5/069* (2013.01)

(58) Field of Classification Search
CPC .............................. H05K 5/0026; H05K 5/069
USPC ........ 361/728–730, 752, 792; 174/68.1, 250, 174/254, 255
See application file for complete search history.

(56) References Cited

U.S. PATENT DOCUMENTS

| 5,113,316 A * | 5/1992 | Navarro | H05K 1/144 174/541 |
| 5,998,738 A * | 12/1999 | Li | H05K 1/028 174/250 |
| 7,948,758 B2 * | 5/2011 | Buhler | H01L 23/3735 29/837 |
| 9,560,759 B2 * | 1/2017 | Fujii | H01L 23/34 |

* cited by examiner

*Primary Examiner* — Hung S Bui
(74) *Attorney, Agent, or Firm* — Davis & Bujold, PLLC (57) ABSTRACT

19 Claims, 8 Drawing Sheets

DENSE OUT OF PLANE INTERCONNECT INSIDE HERMETICALLY SEALED MODULES

This application claims benefit from U.S. Provisional Application No. 62/014,326 filed Jun. 19, 2014.

STATEMENT OF GOVERNMENT INTEREST

This invention was made with United States Government support under Contract No. H94003-04-D-002-0068 awarded by the US Department of the Air Force. The United States Government has certain rights in the invention.

FIELD OF THE INVENTION

The invention relates to interconnection of various components with one another and, more particularly, to interconnection of various components inside a completely sealed housing such as interconnection of various components within a hermetically sealed microwave module.

BACKGROUND OF THE INVENTION

There are few dense interconnect options inside closed and/or sealed housings or container(s), e.g., a channelized hermetic microwave module, that connect to other routing planes, e.g., vertical interconnect. There is a need for a way to make the vertical connections be as small as possible, in and out of plane. These dense connections allow for lighter integration of the bias and control circuitry inside the housing walls.

SUMMARY OF THE INVENTION

Wherefore, it is an object of the present invention to overcome the above mentioned shortcomings and drawbacks associated with the prior art.

An object of the present invention is to eliminate any feed through holes or openings in a central portion of the central core, which are provided for directly connecting the multilayered substrate with the circuit card assembly.

Another object of the present invention is to address the high tolerances which are typically required by the feed through holes or openings in the central core which is, necessary for ensuring proper electrical connection between the associated connectors of a multilayer substrate, located on one side, and associated connectors of a circuit card assembly located on another side.

A further object of the present invention is to simplify the connection of the multilayered substrate and the circuit card assembly with one another within the module and also improve the overall efficiency and performance of the module.

Yet another object of the present invention is to provide a multilayer substrate which has at least one, preferably a plurality of flexible tabs which extend from the main portion of the multilayer substrate and are readily able to be bent folded and reconfigured 180° in order to facilitate electrical connection of the electrical contacts of the multilayer substrate with the associated electrically connectors of the circuit card assembly.

A still further object of the present invention is to provide at least one, and preferably a plurality of passageways, about a periphery of the central core, which facilitate connection between the flexible coupling tabs of the multilayer substrate with the circuit card assembly.

A still further object of the present invention is to group all of the electrical contacts of the multilayer substrate at the remote free end of one of the flexible coupling tabs and also group all of the associated electrical contacts of the circuit card assembly in one or more peripheral areas of the circuit card assembly, e.g., typically four or less locations, in order to simplify the connection of the electrical connectors of the multilayer substrate with the associated electrical connectors of the circuit card assembly.

Yet another object of the present invention is to increase the signal density of the flexible coupling tabs so that each flexible coupling tab has a signal density of at least 100 single traces per inch.

All microwave signals are typically routed on a single low loss multilayer substrate. Typically, this substrate has openings formed therein for receiving one or more septum walls, formed on the microwave side or primary support surface of the central core of the housing. In order to connect the single low loss multilayer substrate with the electrical contact located on the opposed secondary support surface of the central core, at least one portion of the multilayer substrate, e.g., the flexible coupling tabs, wraps around an edge of the central core toward the secondary support surface of the module for connection to the bias and control printed board assembly or the circuit card assembly (CCA). In order to facilitate ease of connection, a standard low-profile SMT connector is typically located between and facilitates connection of the electrical contacts located at the remote free end of the RF Flex multilayer substrate and with the electrical contact(s) generally located about the periphery of the circuit card assembly. Generally, any component(s) which does not need to be in or close to the RF signal path is located on or comprises part of the bias and control circuit card assembly.

The present invention also relates to a hermetically sealed module comprising a central core housing including a perimeter side wall and a central core having opposed primary and secondary support surfaces; at least one coupling passageway being formed within the central core adjacent the perimeter side wall of central core housing; a sealed electrical connector interface which facilitates communication with components accommodated within the central core housing; a multilayer substrate, having at least one flexible coupling tab, being supported by the primary support surface; at least one surface mounted component being supported by the secondary support surface; the at least one flexible coupling tab passing through the at least one coupling passageway and a SMT connector couples a plurality of signal traces of the multilayer substrate with an electrical connection array of the at least one surface mounted component; and primary and secondary lids being respectively securing to opposed sides of the perimeter side wall to form the hermetically sealed module.

The present invention also relates to a microwave module comprising: a housing with opposed lids, a low loss multilayer substrate for routing microwave signals which wraps around the module to connect to a bias and control circuit card assembly, and a low-profile SMT connector attached to the substrate and the circuit card assembly.

BRIEF DESCRIPTION OF THE DRAWINGS

The accompanying drawings, which are incorporated in and constitute a part of the specification, illustrate various embodiments of the invention. Together, the drawings, with the general description of the invention given above, and the detailed description of the drawings given below, serve to explain the principles of the invention. The invention will now be described, by way of example, with reference to the accompanying drawings in which.

It should be understood that the drawings are not necessarily to scale and that the disclosed embodiments are sometimes illustrated diagrammatical and in partial views. In certain instances, details which are not necessary for an understanding of this disclosure or which render other details difficult to perceive may have been omitted. It should be understood, of course, that this disclosure is not limited to the particular embodiments illustrated herein.

DETAILED DESCRIPTION OF THE PREFERRED EMBODIMENTS

The present invention will be understood by reference to the following detailed description, which should be read in conjunction with the appended drawings. It is to be appreciated that the following detailed description of various embodiments is by way of example only and is not meant to limit, in any way, the scope of the present invention.

Turning now to FIGS. 1-4B, a brief description concerning the various components of the central core housing 4 of the microwave module 2 will now be briefly discussed. This discussion will then be followed by a brief discussion of the remaining components of the microwave module 2 as well as assembly thereof. As shown in those Figures, the module 2 according to the present invention has a central core housing 4 which includes a perimeter side wall 6 which generally comprises opposed first and third side walls 8, 12 and opposed second and fourth side walls 10, 14 which are all formed continuously and integral with one another. The opposed first and third side walls 8, 12 and the second and the fourth side walls 10, 14 are all formed integrally with one another and with a generally planar central core 16. An inner perimeter edge of each opposed side of the central core housing 4 has a perimeter lid recess 18 formed therein which facilitates receiving and sealing of a respective primary or a secondary lid 20, 22, as will be discussed below in further detail.

As noted above, the central core 16 is formed integral with the perimeter side wall 6 of the central core housing 4. The perimeter side wall 6 of the central core housing 4 typically has a height of between about ½ inch to about 1½ inches or so, depending upon the particular application. The central core 16 typically has a thickness of about 1/16 of an inch to about ⅛ of an inch or so, depending upon the particular application. The central core 16 extends normal to and between the opposed first and third side walls 8, 12 and as well as between the opposed second and fourth side was 10, 14. The central core 16 is also generally located centrally between the opposed perimeter edges of the side wall 6 of the central core housing 4. This arrangement permits various microwave and electronic components 70, as shown in FIGS. 5, 6, 7A and 7B, for example, to be supported by either the primary or the secondary support surfaces 30, 32 of the central core 16 while still sufficiently spacing such components from either the primary or the secondary lids 20 or 22, after final assembly of the microwave module 2. As will be described below in further detail, some of the module components 70 are mounted to the primary support surface 30, e.g., typically an RF flex multilayer substrate 28, while the remaining components 70 are typically mounted to the secondary support surface 32.

At least one, and preferably two or more coupling passageways 34 are formed within and through the central core 16. Each one of the coupling passageways 34 is formed closely adjacent the side wall 6 of the central core housing 4 and extends completely through the central core 16. Each coupling passageway 34 is typically either oval or rectangularly shaped and has a length of about ¾±½ inch and a width of about ¼±⅛ of an inch. Each coupling passageway 34, following installation of the multilayer substrate 28, is located between a perimeter edge of a main portion of the multilayer substrate 28 and an inwardly facing surface of the side wall 6 of the central core housing 4. The purpose of the coupling passageways 34 is to provide a connection passage though the central core 16 which facilitates electrical coupling of all of the electrical or electronic components 70, supported by the primary support surface 30, with all of the electrical electronic components 70, supported by the secondary support surface 32, of the microwave module 2. That is, according to the present invention, all direct feed-through connections, between the primary and the secondary support surfaces 30, 32, are eliminated in favor of the one or more perimeter passageways and this simplifies design, manufacture and assembly of the microwave module 2.

To facilitate assembly of the desired substrate(s)/component(s) to either the primary and/or the secondary support surfaces 30, 32 of the central core 16, as generally shown in FIGS. 2A-3B for example, a plurality of dies 36 (e.g., as many as 50-100 dies) may be supported by one or both of those support surfaces 30, 32. As is conventional in the art, during an initial assembly step, a base or bottom surface of each one of the dies 36 is permanently secured, e.g., by an epoxy, to either the primary or the secondary support surfaces 30, 32 of the central core 16 to achieve permanent connection of the respective die 36 at a desired location along the desired support surface 30, 32 of the central core 16.

As shown in FIGS. 2A to 4B, the secondary support surface 32, and possibly the primary support surface 30, of the central core 16 may have one or more recessed cavities 38 formed therein, which facilitates accommodating one or more surface mounted plastic parts or components within the central core housing 4. Each recessed cavity 38 extends only partially into the central core 16 and is sized so as to space any accommodated surface mounted plastic parts or components slightly away from and out of contact with the central core 16.

Figure 1:
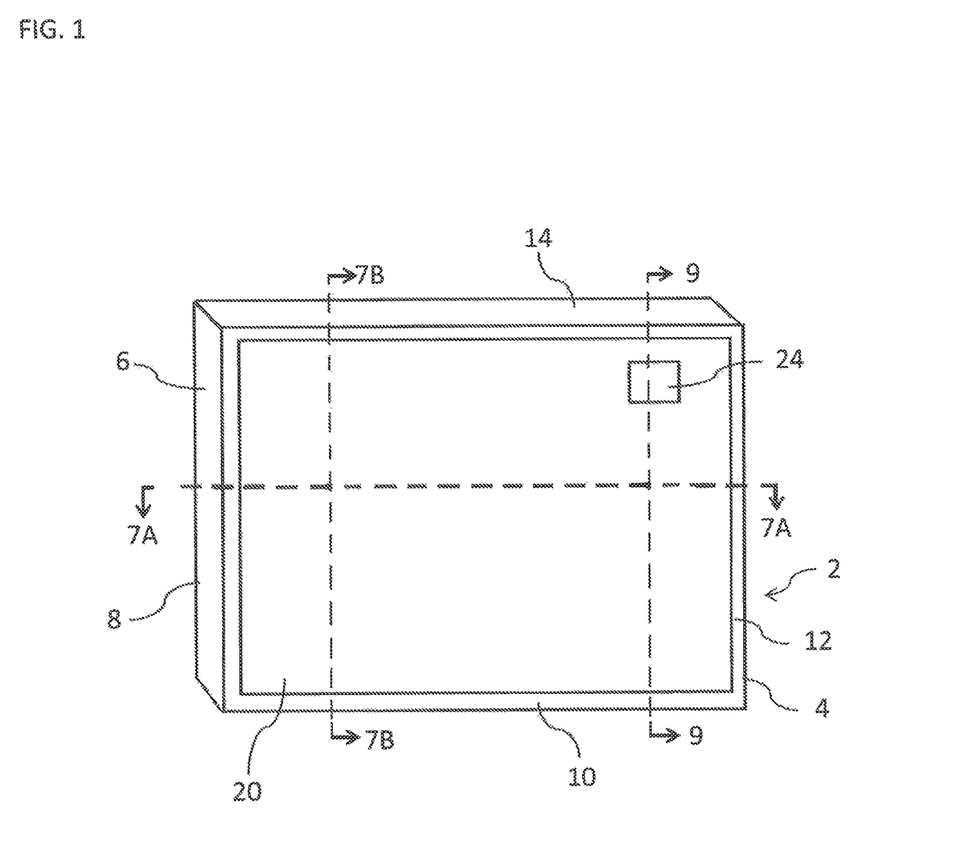
FIG. 1 is a diagrammatic perspective view of the improved module according to the present invention.
Figure 2A:
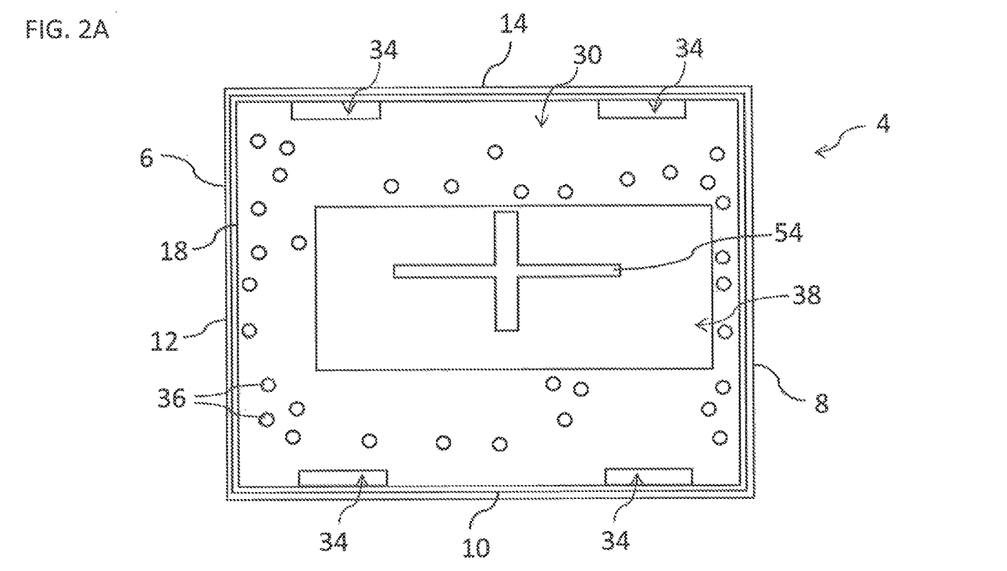
FIG. 2A is a diagrammatic front elevational view, with a primary lid being removed and prior to installation of the multilayer substrate, of the primary side of the central core housing of FIG. 1.
Figure 2B:
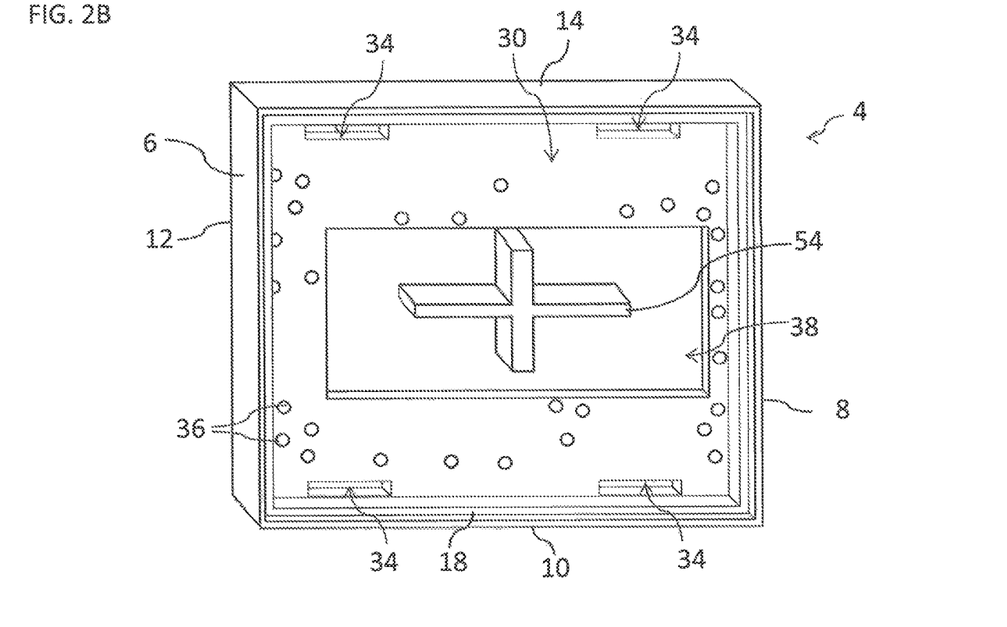
FIG. 2B is a diagrammatic perspective view of the primary side of the central core housing according of FIG. 2A.
Figure 3A:
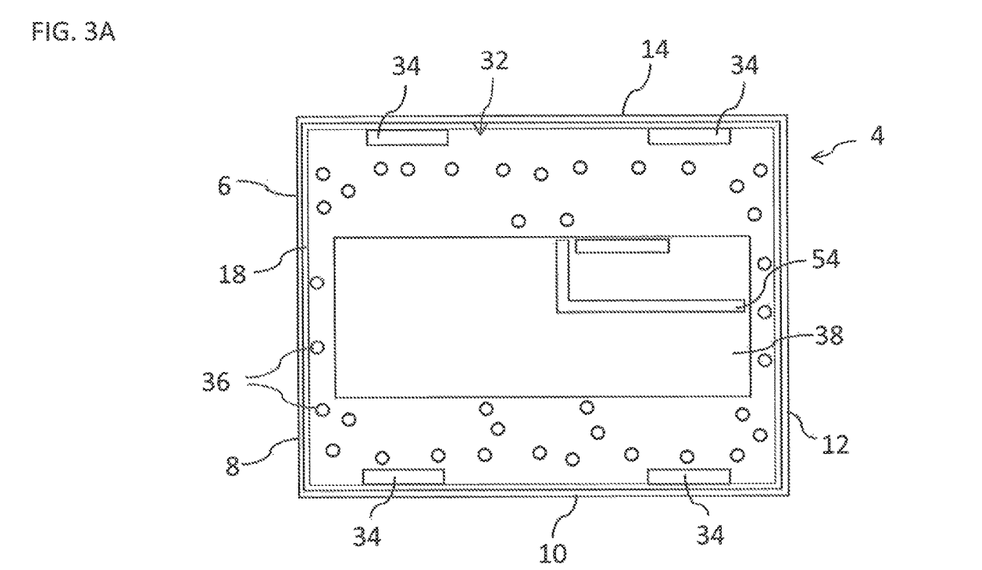
FIG. 3A is a diagrammatic front elevational view, with a secondary lid being removed and prior to installation of the circuit card assembly, of the secondary side of the central core housing of FIG. 1.
Figure 3B:
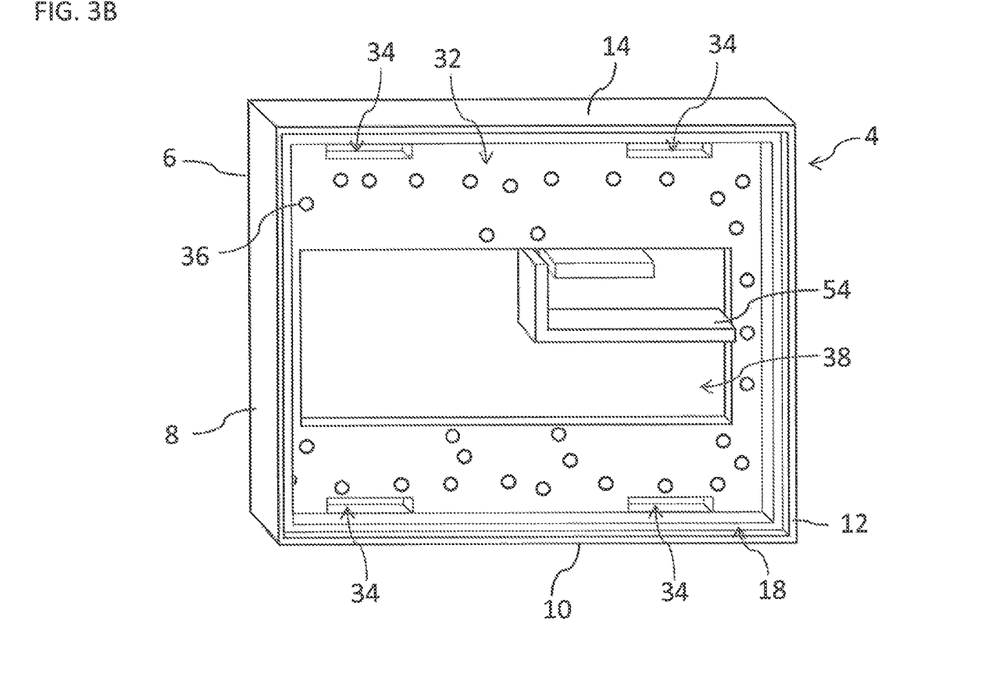
FIG. 3B is a diagrammatic perspective view of the secondary side of the central core housing according of FIG. 3A.
Figure 4A:
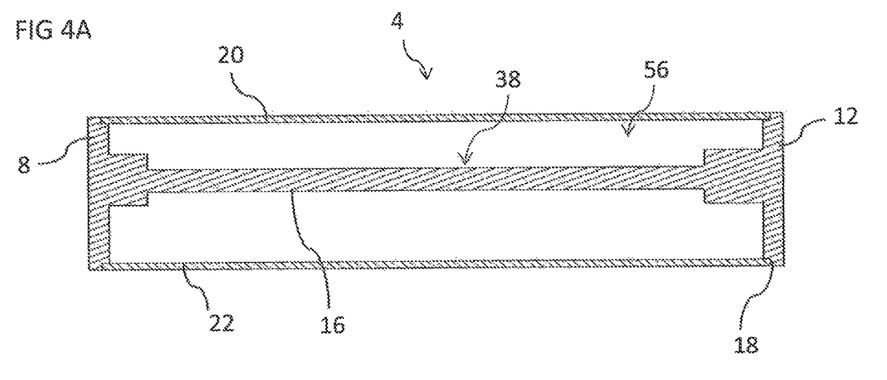
FIG. 4A is diagrammatic cross sectional view of the improved module, generally along section line 7A-7A of FIG. 1, prior to installation of the multilayer substrate and the circuit card assembly.
Figure 4B:
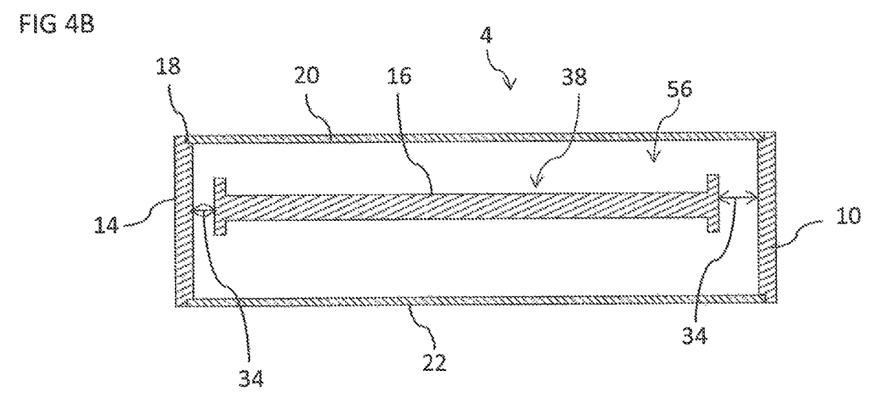
FIG. 4B is diagrammatic cross sectional view of the improved module, generally along section line 7B-7B of FIG. 1, prior to installation of the multilayer substrate and the circuit card assembly.
Figure 5:
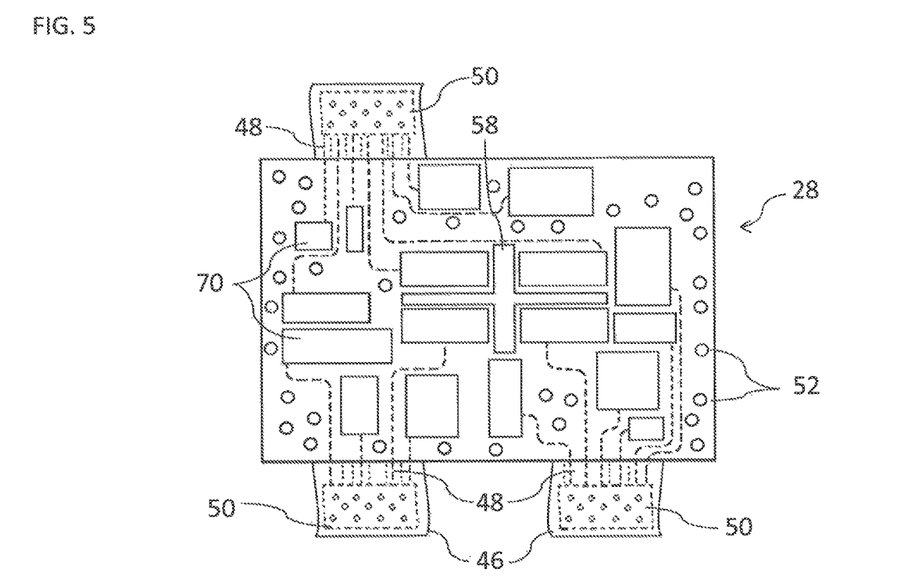
FIG. 5 is a diagrammatic top plan view of a multilayer substrate which is to be secured to the primary side of the central core housing.

With reference now to FIG. 5, a brief discussion concerning the multilayer substrate 28, which is typically mounted on the primary support surface 30 of the central core 16, shown in FIGS. 2A and 2B, will now be provided. As is conventional in the art, the multilayer substrate 28 typically comprises a plurality of layers of flexible substrates, depending upon the desired circuitry and function of the microwave module 2. That is, the multilayer substrate 28 typically comprises at least six separate, overlapping layers of substrate and, as is conventional in the art, each one of the separate layers of the substrate typically has the desired layout/artwork so as to provide the desired feature, function or purpose. In addition, as is conventional in the art, each one of the layers of the substrate typically has copper artwork, formed thereon, which tends to increase the overall rigidity of the flexible substrate and generally resists bending thereof.

Figure 8:
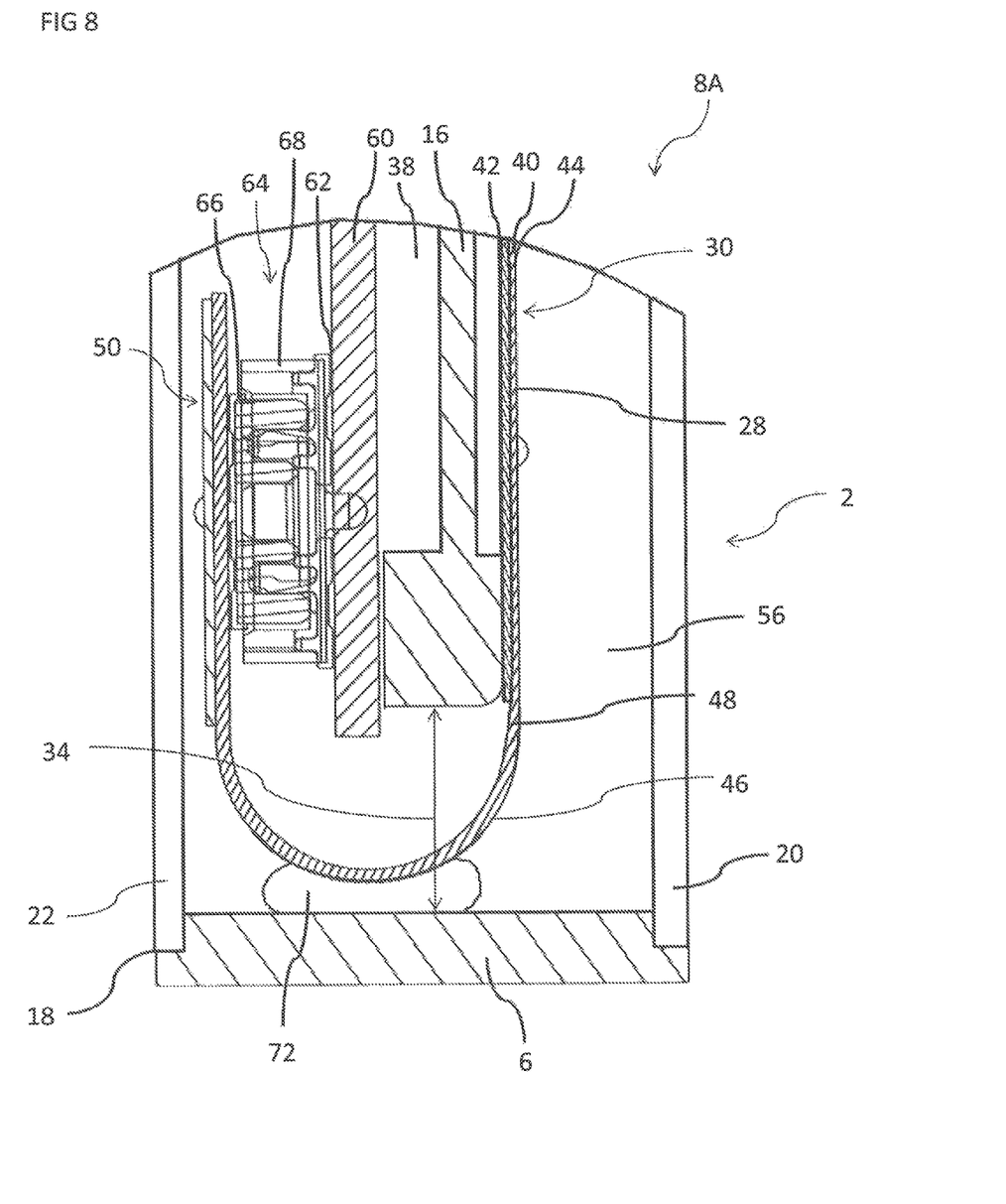
FIG. 8 is an enlarged diagrammatic representation of area A8 of FIG. 7B showing connection of the coupling tab with the SMT connector of the circuit card assembly.

According to the present invention, the bottom surface 40 of the multilayer substrate 28 is typically plated or covered with a copper layer 42 (see FIG. 8) which forms a grounding surface for grounding the multilayer substrate 28 with the central core 16, following installation of the multilayer substrate 28 on the primary surface of the central core 16. As generally shown in FIG. 8, the multilayer substrate 28 has a top layer 44 which, with intermediate layers sandwiched between the top and bottom layers, completes formation of the multilayer substrate 28.

The multilayer substrate 28 has at least one, and typically two or more, flexible coupling tabs 46, the purpose of which will become apparent from the following discussion. Typically, these flexible coupling tabs 46 are formed from a plurality of the intermediate layers of the multilayer substrate 28, i.e., the layers located between the top and the bottom layers of the multilayer substrate 28. The electrical connections or signal traces 48 from the various layers of the multilayer substrate 28 exit from the main portion of the multilayer substrate 28 via one or more of the flexible coupling tabs 46. The signal traces 48 extend through the flexible coupling tabs 46 from the main portion of the multilayer substrate 28 and terminate at a connection end 50 of the coupling tab 46. The signal traces 48 are slightly spaced from but arranged parallel to one another. Each one of the flexible coupling tabs 46 typically has a cross hatching structure which assists with reliable bending of the flexible coupling tabs 46 without compromising the overall integrity and/or electrical conductivity of the signal traces 48 extending through the flexible coupling tabs 46. Due at least in part to this arrangement, the present invention is capable of achieving a signal density of 100 signal traces per inch within the flexible coupling tabs 46.

As is well known in the art, since the multilayer substrate 28 operates at high frequency, it is highly desirable to use a "bare die" technique for installing the multilayer substrate 28 on the primary support surface 30 of the central core 16. As indicated above, a plurality of dies 36 are utilized for attaching the desired substrates and/or components 70 to either the primary or the secondary surfaces 30, 32 of the central core 16 by this technique.

During a first step of the manufacturing process, each one of these plurality of dies 36 is preferably epoxied, or otherwise permanently secured, to either the primary or the secondary support surface 30, 32 of the central core 16 at desired locations. To facilitate engagement between the associated dies 36 and the multilayer substrate 28, a plurality of strategically located die apertures or holes 52 (see FIG. 5) are formed in and extend completely through each one of the layers of the multilayered substrate 28. Each die aperture or hole 52 is slightly larger in diameter than the diameter of the associated die 36 so as to matingly receive the respective die 36, when the multilayered substrate 28 is installed on the primary support surface 30 of the central core 16. As illustrated, the location of the die apertures or holes 52 of FIG. 5 respectively correspond with location of the plurality of dies 36 of FIGS. 2A and 2B. Similarly, the location of the die apertures or holes 52 of FIG. 6 respectively correspond with the location of the plurality of dies 36 of FIGS. 3A and 3B.

In order to facilitate permanent engagement and retention of the multilayer substrate 28 with the respective die 36 of the central core 16, following installation of the multilayer substrate 28 on the primary support surface 30 of the central core 16, each one of the dies 36 is typically ribbon bonded (as diagrammatically shown in FIG. 7A) to a closely adjacent perimeter portion of the respective die aperture or hole 52 of the multilayered substrate 28. Such ribbon bonding technique typically results in deposition of a bonding layer which is about 0.5 mils thick and about 3 mils wide.

Figure 7A:
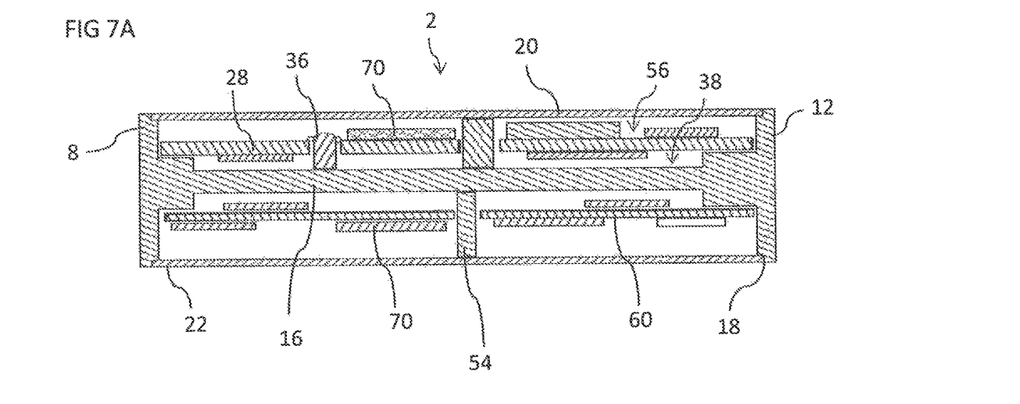
FIG. 7A is a diagrammatic cross sectional representation along section line 7A-7A of FIG. 1.
Figure 7B:
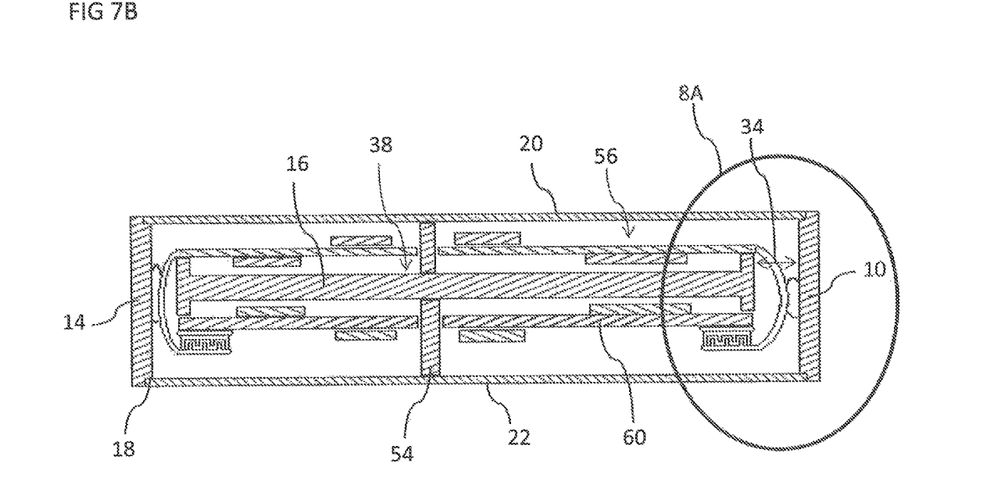
FIG. 7B is a diagrammatic cross sectional representation along section line 7B-7B of FIG. 1.

In some applications, one or more septum walls 54 may be formed on at least the primary support surface 30 of the central core 16, and possibly the secondary support surface 32. Each one of the septum walls 54 generally extends between the primary support surface 30 of the central core 16 and an inwardly facing surface of the primary lid 20 or secondary lid 22, once assembled with the central core housing 4 (as generally shown in FIGS. 7A and 7B). Each of the septum walls 54 is useful in dividing, partitioning or separating the interior chamber 56 of the central core housing 4 into a plurality of partially separate compartments or regions. Such separation facilitates shielding one or more components 70 of the multilayer substrate 28 from one or more other components 70 of the multilayer substrate 28.

One or more strategically located septum apertures or holes 58, which extend completely through each layer of the multilayered substrate 28, is/are arranged so as to closely receive a respective septum wall 54 formed in the primary support surface 30 of the central core 16, when the multilayered substrate 28 is installed on the central core 16. As illustrated, the location of the septum apertures or holes 58 of FIG. 5 respectively correspond with location of the septum walls 54 of FIGS. 2A and 2B. Similarly, the location of the septum apertures or holes 58 of FIG. 6 respectively correspond with the location of the septum walls 54 of FIGS. 3A and 3B. It is to appreciated that the shape, the length, the width and the thickness of each septum wall 54 can vary, depending upon the particular needs of the application at hand. As the various other components 70 and other features of the multilayer substrate 28 are conventional and well known in the art, a further detailed discussion concerning the same is not provided.

Figure 6:
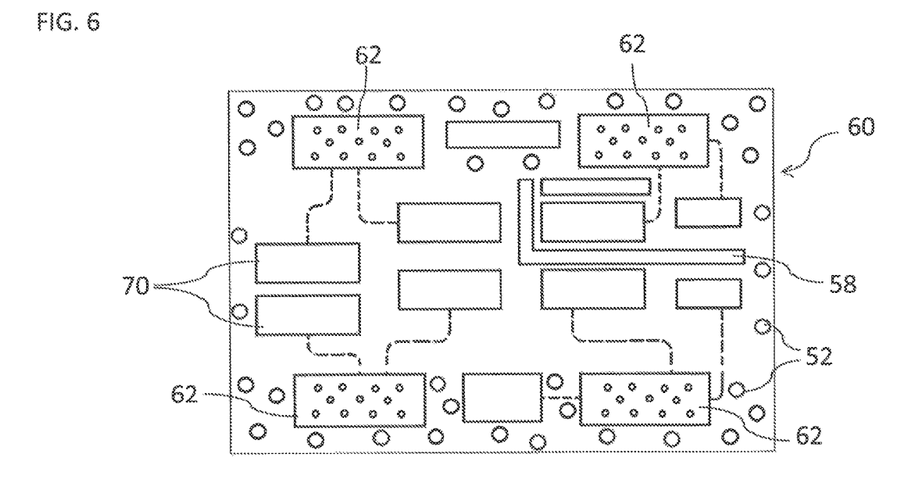
FIG. 6 is a diagrammatic top plan view of a circuit card assembly which is to be secured to the secondary side of the central core housing.

As shown in FIGS. 6-7B, other surface mounted components 70 are typically supported by the secondary support surface 32 of the central core 16. It is to be appreciated that the one or more surface mounted components 70 may possibly be individually connected to the secondary support surface 32 of the central core 16, by either screws or some other conventional fastener(s) (not shown in detail). These fasteners may be releasable in order to facilitate releasable attachment of such surface mounted component(s) 70 to the central core 16. Alternatively, the one or more surface mounted components 70 can each be directly epoxied to the secondary support surface 32 of the central core 16 in order to facilitate a permanent attachment thereto. For many applications, two or more surface mounted components 70 are assembled and electrically connected together with one another in a conventional fashion and packaged within one or more larger unitary assemblies of surface mounted components 70, such as a printed board assembly or circuit card assembly 60. This facilitates ease of installation of the various surface mounted components 70 on the secondary support surface 32 of the central core 16. The unitary or circuit card assembly 60 of surface mounted components 70 is then epoxied or releasably secured, by screws or some other conventional fastener(s) (not shown in detail), to the secondary support surface 32 of the central core 16.

As noted above and illustrated in FIGS. 3A-4B and 7A-8, the secondary support surface 32 of the central core 16 typically has one or more recessed cavities 38 which facilitate receiving and accommodating one or more surface mounted components 70 carried by or supported on a rear surface of the unitary or circuit card assembly 60. In such instance, a perimeter of the rear surface of the unitary or circuit card assembly 60 is epoxied or secured, e.g., by screws or some other conventional fastener(s), to the secondary support surface 32 of the central core 16. Meanwhile any surface mounted components 70, supported on the rear surface of the circuit card assembly 60, is/are accommodated within the recessed cavity 38. An outwardly facing surface of the circuit card assembly 60 has a plurality of the electrical contacts which are grouped together with one another to form an electrical connection array 62 which facilitates connection with the signal traces 48 of the flexible coupling tabs 46, as will be discussed below in further detail. As is conventional and well-known in the art, the surface mounted components 70 (e.g., bias, control and digital signal processing components, etc.) may comprise, for example, one or more voltage regulators, amplifiers, control circuits, field programmable gauges, etc.

As shown in FIGS. 5-7B as well as in FIG. 8, a standard low profile SMT connector 64 is utilized for interconnecting the remote free ends of the signal traces 48 of each the flexible coupling tab 46 with the respective electrical connection array 62 of the circuit card assembly 60. According to one embodiment, a first portion 66 of the standard low profile SMT connector 64 is connected, e.g., by conventional soldering, to the terminated free ends of the signal traces 48 located on a rear surface of each of the flexible coupling tab 46, while a mating second portion 68 of the standard low profile SMT connector 64 is connected, e.g., by conventional soldering, to the plurality of the electrical contacts of the electrical connection array 62 of the circuit card assembly 60. As a result of such arrangement, when one or more of the flexible coupling tabs 46 passes through the associated coupling passageway 34, and is bent approximately 180 degrees (see FIGS. 7B, 8 and 9) into a U-shape, the mating first and second portions 66, 68 of the standard low profile SMT connector 64 can be easily and reliably connected with one another and thereby achieve the desired electrical connections between the components 70 of the multilayer substrate 28, supported by the primary support surface 30 of the central core 16, and the one or more surface mounted components, supported by the circuit card assembly 60 secured to the secondary support surface 32 of the central core 16.

Alternatively, it is to be appreciated that the standard low profile SMT connector 64 may be connected, e.g., by conventional soldering, to either the terminated free ends of the signal traces 48 located on the rear surface of each of the flexible coupling tab 46 or to the plurality of the electrical contacts of the electrical connection array 62 of the circuit card assembly 60. During assembly, the other of the plurality of the electrical contacts of the electrical connection array 62 of the circuit card assembly 60 or the terminated free ends of the signal traces 48 of the flexible coupling tab 46 is then connected with the standard low profile SMT connector 64, e.g., by soldering, etc., to complete the connection. Or still further, the standard low profile SMT connector 64 may be a completely separate component which is installed between the respective mating connectors of both the flexible coupling tabs 46 and the circuit card assembly 60, during final assembly of the module 2, to facilitate interconnection of the signal traces 48, located on a rear surface at a connector end of each flexible coupling tab 46, with the plurality of the electrical contacts of the electrical connection array of the circuit card assembly 60.

Following installation of the multilayer substrate 28 on the primary support surface 30, the circuit card assembly 60 on the secondary support surface 32, and interconnection of the signal traces 48 of each flexible coupling tab 46 of the multilayer substrate 28 with the plurality of the electrical contacts of the electrical connection array 62 of the circuit card assembly 60, the primary and secondary lids 20, 22 are then installed within each respective lid recess 18, as shown in FIGS. 7A-9 and then permanently connected or secured thereto, e.g., by laser welding. Immediately prior to hermetically sealing the module 2, the internal chamber 56 may be filled with an inert gas, such as argon, which improves the overall life of the module 2. The primary and the secondary lids 20, 22 extend generally parallel to one another but are spaced from one another. This forms a completely closed and hermetically sealed central core housing 4 which, in turn, defines the hermetically sealed internal chamber 56 which accommodates a variety of microwave and electrical components.

As shown in FIGS. 7B-9, and previously discussed above, the multilayer substrate 28 is formed such that each flexible coupling tab 46 can be bent into a wraparound U-shaped configuration. That is, a bottom surface of the main body of the multilayer substrate 28 has a first planar portion which is configured to matingly and intimately engage with the primary support surface 30 of the central core 16 while the flexible coupling tabs 46 of the multilayer substrate 28 are each designed so as to be easily bent, curved or shaped into the wraparound configuration which is generally U-shaped. As generally shown, the free end of each flexible coupling tab 46 supports the connection ends of the signal traces 48 of the multilayer substrate 28, and the flexible coupling tab 46 is curved or bent approximately 180 degrees so as to wrap around an edge of the central core 16 and be located generally closely adjacent the second support surface 32 of the central core 16 and facilitate connection with the electrical connection array 62 of the circuit card assembly 60.

Due to such arrangement, it is to be appreciated that the associated contacts of the multilayer substrate 28 are provided on the bottom, lowermost layer of the flexible coupling tabs 46 so as to facilitate connection with the corresponding electrical connection array 62 of the one or more surface mounted components of the circuit card assembly 60. As noted above, the connection of the contacts of the multilayer substrate 28 with the associated contacts of the one or more surface mounted components is achieved by the standard low profile SMT connector 64, typically carrier by the multilayer substrate 28 and/or the circuit card assembly 60.

During assembly, a top, outwardly facing surface of each of the flexible coupling tabs 46 may be attached, at 72, e.g., by an epoxy, (see FIG. 8), to the central core housing 4. Such connection 72 allows the flexible coupling tabs 46 to be permanently secured to an adjacent portion of the perimeter side wall 6 of the central core housing 4. This permanent connection ensures the positioning of the flexible coupling tabs 46 with respect to the secondary support surfaces SMT connector 64 and adjacent the housing 4 of the central core 16.

Figure 9:
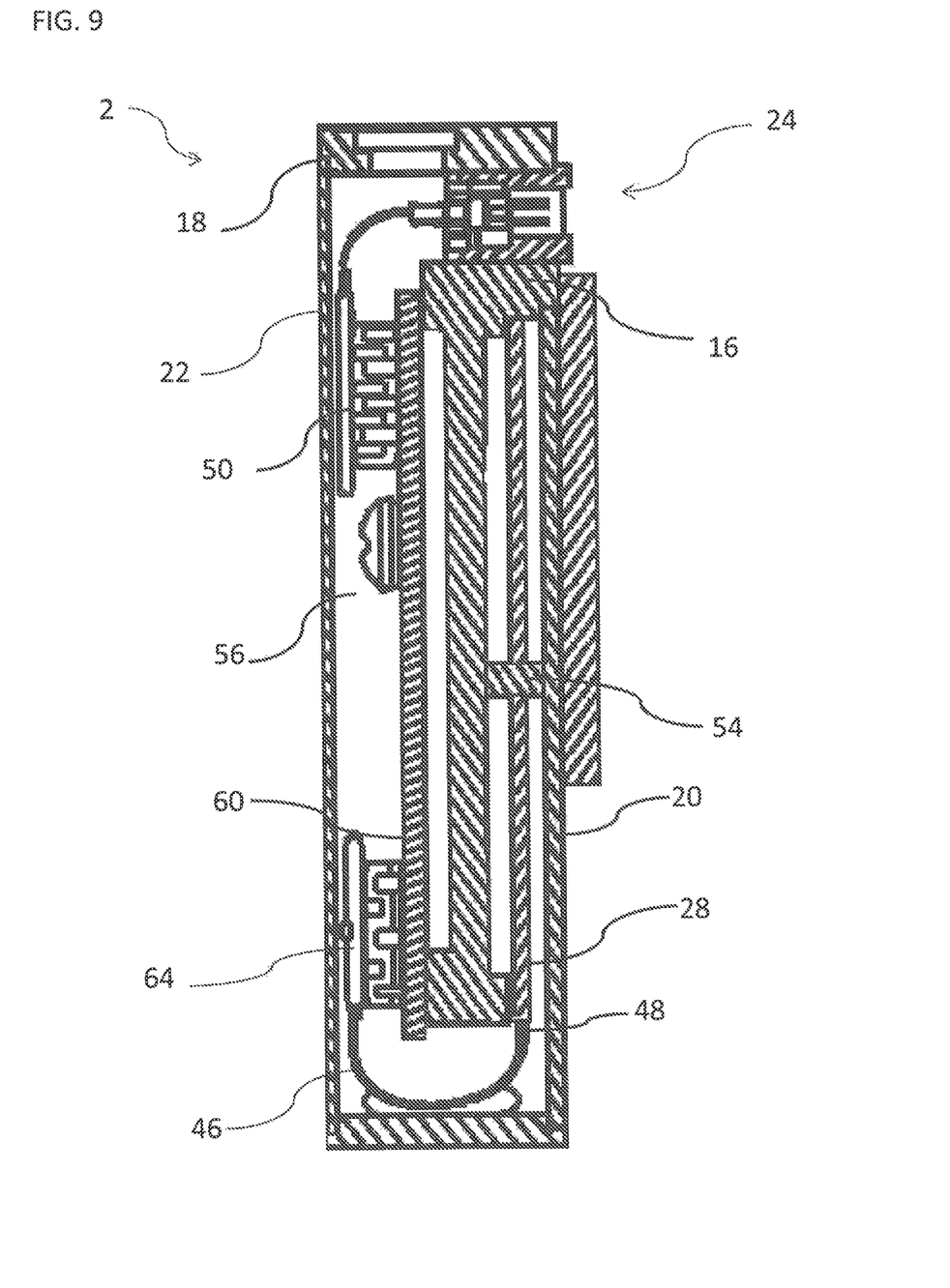
FIG. 9 is a diagrammatic cross sectional representation showing an electrical connector interface which facilitates electrical connection with the various electrical components accommodated and sealed within the module.

As is conventional in the art and shown in FIG. 9, a sealed electrical connector interface 24 is located at a desired location within the exterior surface of the housing 4 and this connector interface 24 facilitates electrical connection with the various electrical components 70 accommodated and hermetically sealed within the internal chamber 56 of the module 2. As shown, a first portion of the connector interface 24 is exposed and can readily be engaged by a conventional connector (not shown) while a second portion of the connector interface 24 is located inside the module 2 and is connected to a desired component, e.g., in this instance connected to the circuit card assembly 60 via a SMT connector 74 and conventional cabling or wiring 76. As noted above, an external conventional connector engages with the connector interface 24 and permits information, data, signals, electrical pulses, etc., to flow to and from the module 2 in a conventional manner. As such electrical connections, as well as their sealing interface with central core housing 4, are conventional and well known in the art, a further detailed description concerning same is not provided.

The approach of the present invention allows for 100+ bias/control signals to be routed between a traditional SMT CCA and a chip and a wire portion of a hermetic microwave module 2. The effective pitch of this interconnection is limited to the fine pitch SMT connector 64 (<60 per linear inch). This approach also reduces the alignment requirements between the MW and DC/CTRL control side of the module 2. This approach eliminates feed-thrus in the floor of the housing 4. It also allows for the bias/control circuit card assembly 60 to be assembled and tested prior to installation within the module 2. It allows for looser tolerances between the RF and DC sides of the module 2. This approach allows the integration of low cost SMT IC inside a Hybrid Microwave Module 2 where appropriate. This approach also reduces the external support circuitry that is adjacent to the microwave module 2.

While the present invention has been described in connection with the preferred embodiments of the various figures, it is to be understood that other similar embodiments may be used or modifications and additions may be made to the described embodiment for performing the same function of the present invention without deviating there from. Therefore, the present invention should not be limited to any single embodiment, but rather construed in breadth and scope in accordance with the recitation of the appended claims. In addition, it is to be understood that the phraseology and terminology used herein is for the purpose of description and should not be regarded as limiting. The use of "including," "comprising," or "having," and variations thereof herein, is meant to encompass the items listed thereafter and equivalents thereof as well as additional items while only the terms "consisting of" and "consisting only of" are to be construed in a limitative sense.

Wherefore, I claim:

1. A hermetically sealed module comprising:
   a central core housing including a perimeter side wall and a central core having opposed primary and secondary support surfaces;
   at least one coupling passageway being formed within the central core adjacent the perimeter side wall of central core housing;
   a sealed electrical connector interface which facilitates communication with components accommodated within the central core housing;
   a multilayer substrate, having at least one flexible coupling tab, being supported by the primary support surface;
   at least one surface mounted component being supported by the secondary support surface;
   the at least one flexible coupling tab passing through the at least one coupling passageway and a SMT connector couples a plurality of signal traces of the multilayer substrate with an electrical connection array of the at least one surface mounted component; and
   primary and secondary lids being respectively securing to opposed sides of the perimeter side wall to form the hermetically sealed module.

2. The hermetically sealed module according to claim 1, wherein the central core is located centrally between opposed perimeter edges of the side wall of the central core housing so as to permit supporting components on the primary and secondary support surfaces of the central core while still sufficiently spacing the components from the primary and the secondary lids of the hermetically sealed module.

3. The hermetically sealed module according to claim 1, wherein a plurality of dies are secured to at least the primary support surface to facilitate securing the multilayer substrate to the primary support surface.

4. The hermetically sealed module according to claim 3, wherein each of the plurality of dies are secured to at least the primary support surface by an epoxy.

5. The hermetically sealed module according to claim 3, wherein a plurality of die apertures, which extend completely the multilayered substrate, are formed in the multilayered substrate, and a respective one of the plurality of die apertures receives a respective one of the plurality of dies to facilitate installation of the multilayer substrate on the primary support surface of the central core, and, following installation of the multilayer substrate on the primary support surface of the central core, and each one of the plurality of dies is ribbon bonded to a closely adjacent perimeter portion of the multilayered substrate to permanently secure the multilayered substrate to the central core.

6. The hermetically sealed module according to claim 1, wherein at least the secondary support surface of the central core has at least one recessed cavity formed therein which facilitates accommodating at east one surface mounted component within the central core housing.

7. The hermetically sealed module according to claim 1, wherein the multilayer substrate comprises at least six separate layers of overlapped substrate and each one of the separate layers of the substrate has at least one of desired artwork and desired features.

8. The hermetically sealed module according to claim 1, wherein the bottom surface is plated with a copper layer so as to form a grounding surface for grounding the multilayer substrate to the central core, following installation of the multilayer substrate on the primary surface of the central core.

9. The hermetically sealed module according to claim 1, wherein the at least one flexible coupling tab only comprises intermediate layers of the multilayer substrate, located between top and bottom layers of the multilayer substrate, and the signal traces extend through the at least one flexible coupling tab from a main portion of the multilayer substrate to a connection end, located adjacent a remote free end of the at least one flexible coupling tab.

10. The hermetically sealed module according to claim 1, wherein the at least one flexible coupling tab comprises a plurality of flexible coupling tabs and each flexible coupling tab carries a plurality of signal traces.

11. The hermetically sealed module according to claim 9, wherein the signal traces are spaced from but are arranged parallel to one another and have a density of about 100 signal traces per inch.

12. The hermetically sealed module according to claim 1, wherein at least one septum wall is formed on the primary support surface of the central core, and each at least one septum wall extends between the primary support surface of the central core and an inwardly facing surface of the primary lid, and each at least one septum wall facilitates partitioning an interior chamber of the central core housing into partially separate compartments for shielding at least one component of the multilayer substrate from at least one other component of the multilayer substrate.

13. The hermetically sealed module according to claim 12, wherein at least one septum aperture, which extend completely through the multilayered substrate, is formed within the multilayer substrate and arranged to closely receive the at least one septum wall formed integral with the central core, during installation of the multilayered substrate with the central core.

14. The hermetically sealed module according to claim 1, wherein at least one surface mounted component is supported by the secondary support surface of the central core, and the at least one surface mounted component is connected to the secondary support surface of the central core by either at least one releasable fastener or an epoxy.

15. The hermetically sealed module according to claim 1, wherein a plurality of surface mounted components are electrically connected together with one another and packaged as part of a circuit card assembly, and the circuit card assembly is connected to the secondary support surface of the central core by either at least one releasable fastener or an epoxy.

16. The hermetically sealed module according to claim 1, wherein the SMT connector interconnects the remote free ends of the signal traces of each of the flexible coupling tab with the respective electrical connection array of the circuit card assembly.

17. The hermetically sealed module according to claim 16, wherein a first portion of the SMT connector is connected to the signal traces located on a rear surface at a connector end of each flexible coupling tab while a mating second portion of SMT connector is connected to the plurality of the electrical contacts of the electrical connection array of the circuit card assembly to facilitate connecting the multilayer substrate to the circuit card assembly.

18. The hermetically sealed module according to claim 1, wherein when the at least one flexible coupling tab passes through the at least one coupling passageway to coupling the plurality of components of the multilayer substrate with a plurality of components of the at least one surface mounted component, the flexible coupling tabs is bent approximately 180 degrees so that the SMT connector facilitates connection of the multilayer substrate, supported by the primary support surface of the central core, to the one or more surface mounted components, supported by the secondary support surface of the central core.

19. The hermetically sealed module according to claim 1, wherein the primary and the secondary lids are inserted within a respective perimeter lid recess of the central core housing and permanently connected or secured thereto to form a completely closed and hermetically sealed central core housing which defines a hermetically sealed internal chamber which accommodates a variety of microwave and electrical components.

* * * * *